US011908655B2

(12) United States Patent
Gubbens et al.

(10) Patent No.: US 11,908,655 B2
(45) Date of Patent: Feb. 20, 2024

(54) CRYOTRANSFER HOLDER AND WORKSTATION

(71) Applicant: Gatan, Inc., Pleasanton, CA (US)

(72) Inventors: Alexander Jozef Gubbens, Palo Alto, CA (US); John Andrew Hunt, Fremont, CA (US); Masoud Azimi, Dublin, CA (US); Radosav Pantelic, Basel (CH); Ron Zolkowski, Glenshaw, PA (US); Chris Booth, Livermore, CA (US); Andrew Alan Abbott, Stockton, CA (US)

(73) Assignee: GATAN, INC., Pleasanton, CA (US)

( * ) Notice: Subject to any disclaimer, the term of this patent is extended or adjusted under 35 U.S.C. 154(b) by 407 days.

(21) Appl. No.: 17/080,937

(22) Filed: Oct. 27, 2020

(65) Prior Publication Data

US 2021/0110991 A1 Apr. 15, 2021

Related U.S. Application Data

(62) Division of application No. 16/173,307, filed on Oct. 29, 2018, now Pat. No. 10,832,887.

(Continued)

(51) Int. Cl.
*H01J 37/20* (2006.01)
*G01N 23/20025* (2018.01)
(Continued)

(52) U.S. Cl.
CPC ........ *H01J 37/20* (2013.01); *G01N 23/20025* (2013.01); *G01N 1/42* (2013.01);
(Continued)

(58) Field of Classification Search
CPC ............... G01N 23/20025; H01J 37/20; H01J 2237/20; H01J 2237/2007; H01J 2237/202; H01J 2237/20207; H01J 2237/20214
(Continued)

(56) References Cited

U.S. PATENT DOCUMENTS 5,753,924 A * 5/1998 Swann .................... H01J 37/20
250/442.11
7,132,673 B2 * 11/2006 Fischione ............... H01J 37/08
250/397

(Continued)

FOREIGN PATENT DOCUMENTS

DE 102015100727 A1 7/2016
EP 0106869 A1 5/1984
(Continued)

OTHER PUBLICATIONS

Extended European Search Report dated Mar. 31, 2023 for European Application No. EP 22215538.4-1212.
(Continued)

*Primary Examiner* — Nathaniel J Kolb
(74) *Attorney, Agent, or Firm* — Volpe Koenig

(57) ABSTRACT

A workstation is described for mounting specimens into a cryotransfer holder at cryogenic temperature. The workstation allows rotation about the cryotransfer holder axis to improve access to the sample placement area on the holder and to facilitate easy removal and retrieval of the sample after imaging. The cryotransfer holder includes a cylindrical dewar configured to maintain a constant center of mass about the holder axis regardless of orientation of the dewar.

16 Claims, 18 Drawing Sheets

Related U.S. Application Data

(60) Provisional application No. 62/579,040, filed on Oct. 30, 2017.

(51) Int. Cl.
*G01N 1/42* (2006.01)
*H01J 37/26* (2006.01)

(52) U.S. Cl.
CPC ....... *H01J 37/26* (2013.01); *H01J 2237/0216* (2013.01); *H01J 2237/2001* (2013.01); *H01J 2237/204* (2013.01); *H01J 2237/2005* (2013.01); *H01J 2237/2007* (2013.01); *H01J 2237/20207* (2013.01)

(58) Field of Classification Search
USPC ........... 62/51.1; 250/440.11, 441.11, 442.11, 250/443.11; 73/864.91
See application file for complete search history.

(56) References Cited

U.S. PATENT DOCUMENTS

| | | | | |
|---|---|---|---|---|
| 8,336,405 | B2* | 12/2012 | Stabacinskiene | ....... H01J 37/20 250/443.1 |
| 9,010,202 | B2* | 4/2015 | Stabacinskiene | ....... H01J 37/26 250/443.1 |
| 10,242,841 | B2* | 3/2019 | Miyazaki | ................ H01J 37/20 |
| 2006/0022148 | A1* | 2/2006 | Fischione | ............. H01J 37/244 250/492.21 |
| 2007/0023701 | A1* | 2/2007 | Fishione | ................. H01J 37/22 250/492.21 |
| 2009/0242795 | A1* | 10/2009 | Chao | ........................ G01N 1/42 250/442.11 |
| 2012/0024086 | A1* | 2/2012 | Stabacinskiene | ........................... G01N 23/20033 73/864.91 |
| 2013/0014528 | A1* | 1/2013 | Stabacinskiene | ........................... G01N 23/20033 62/129 |
| 2017/0213694 | A1 | 7/2017 | Lihl et al. | |
| 2017/0370814 | A1 | 12/2017 | Gaechter et al. | |
| 2018/0096817 | A1* | 4/2018 | Miyazaki | ................ H01J 37/20 |
| 2020/0141846 | A1* | 5/2020 | Zandbergen | ............ H01J 37/20 |

FOREIGN PATENT DOCUMENTS

| | | |
|---|---|---|
| JP | 06-215718 A | 5/1994 |
| WO | 2009/145377 A1 | 12/2009 |

OTHER PUBLICATIONS

Leica Microsystems: "Leica EM ACE600 table-top coater with Leica VCT100", Aug. 31, 2012 (Aug. 31, 2012), XP93032093, Retrieved from the Internet: URL:https://www.youtube.com/watch?v=5VW3OfNcvDQ [retrieved on Mar. 15, 2023].

Li Shuoguo et al: "High-vacuum optical platform for cryo-CLEM (HOPE): a new solution for non-integrated multiscale correlative light and electron microscopy", Journal of Structural Biology, vol. 201, No. 1, XP085321702, ISSN: 1047-8477, DOI: 10.1016/J.JSB.2017.11.002, Aug. 31, 2012.

* cited by examiner

CRYOTRANSFER HOLDER AND WORKSTATION

CROSS REFERENCE TO RELATED APPLICATION

This application claims priority under 35 U.S.C. § 121 to U.S. patent application Ser. No. 16/173,307 filed Oct. 29, 2018, which application claims priority under 35 U.S.C. § 119 to U.S. Provisional Patent Application No. 62/579,040 filed Oct. 30, 2017, the disclosures of which are hereby incorporated herein by reference in their entirety.

BACKGROUND

Electron microscopy of samples held at cryogenic temperatures (cryo-EM), including frozen hydrated biological specimens and inorganic materials, is an evolving field that has produced increasingly greater understanding of biological and inorganic structures down to protein and macromolecular levels. Cryotransfer holders are used in applications that require low-temperature transfer and observation of frozen-hydrated specimens for cryo-electron microscopy. In the field of materials science, a cryotransfer holder may also be used in a heating mode with internal heaters that can maintain a sample at temperatures up to 1000 degrees Centigrade. Cryo-workstations provide a protected environment for loading specimen into holder. A Cryo-shield encapsulates frozen-hydrated specimen to protect it from contamination during atmospheric transfers from cryo-workstation to the transmission electron microscope (TEM).

Cryo-electron microscopy is typically performed by mounting a frozen sample on a cryotransfer holder in a preparation apparatus that holds the sample at cryogenic temperatures before and during the mounting of the sample. The cryotransfer holder includes a dewar of liquid cryogen, typically nitrogen or helium, which cools a thermal conductor that extends to a sample stage. Thus, the sample stage may be held at cryogenic temperature while the dewar has sufficient cryogen. The cryotransfer holder also has a shutter that is closed over the sample while the holder is moved from the sample preparation apparatus to an electron microscope column. The shutter prevents the sample from frosting over from moisture in the air. The microscope column is held at vacuum pressures, so the sample shutter can be opened once the ambient air and moisture is substantially removed from the column. A cryotransfer holder is held in place by the electron microscope's goniometer. The goniometer can position the specimen in x, y and z, and can rotate the specimen (by rotating the holder) over angles approaching +/−90 degrees. Holder rotation is typically further limited (between +/−60 and +/−85 degrees) by the extents of the specimen holder interfering with features within the TEM such as the pole piece.

Increases in cryo-EM resolution have resulted from improvements in electron microscopes themselves, image sensors and computing power and methods needed to process the images and correct image distortions caused by disturbances such as vibration and changes in state of the frozen sample. As the entire cryo-EM system resolution increases (e.g. smaller than 0.15 nm for one second exposures is now possible), stability of the specimen holder is often the primary limitation to attainable image resolution. For example, prior art cryotransfer holders 100, as shown in FIGS. 1, 2 and 3, have dewars 10 that are vertically-aligned cylindrical vessels, which do not allow for even distribution of the liquid coolant 40 with respect to the holder axis 30 when the holder 100 and the dewar 10 are rotated about the sample holder axis 30, as shown in FIGS. 2 and 3. This results in detectable vibrations and movement being conducted to the sample 20 while inside the microscope. Furthermore, it is important to have extremely smooth and defect-free surfaces within dewar 10 to reduce the chance of nucleating bubbles at the bottom of the dewar. Otherwise dewar 10 should not be filled to direct contact with the coolant vessel opening 423 in FIG. 5 because the movement, boiling and thermal circulation of the coolant can also vibrate the thermal conductor rod and the sample. Limiting the amount of coolant in the dewar limits the available time the sample can be imaged while being held at cryogenic temperature.

Another source of vibration of the sample holder can be the mechanical linkage to the shutter, which is in close proximity to the sample holder even when the shutter is retracted during imaging of a sample. The mechanical linkage extends back through the dewar and any vibrations or movement caused, for example by boiling of fluid in the dewar or upwelling in the coolant can be transmitted acoustically back through the shutter linkage to the sample holder.

DETAILED DESCRIPTION OF PREFERRED EMBODIMENTS

Those skilled in the art will recognize other detailed designs and methods that can be developed employing the teachings of the present invention. The examples provided here are illustrative and do not limit the scope of the invention, which is defined by the attached claims. The following detailed description refers to the accompanying drawings. The same reference numbers in different drawings may identify the same or similar elements.

Figure 4:
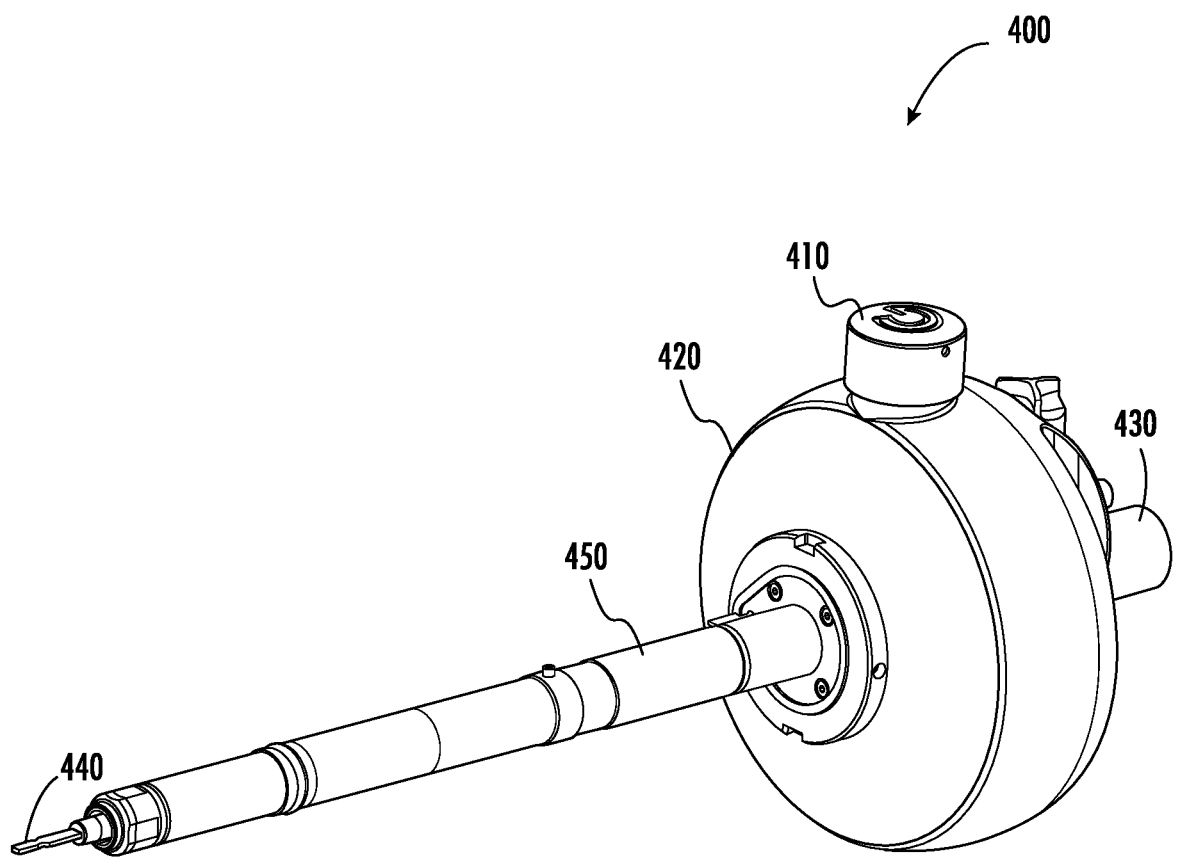
FIG. 4 is an exemplary cryotransfer holder according to an embodiment described herein.
Figure 5:
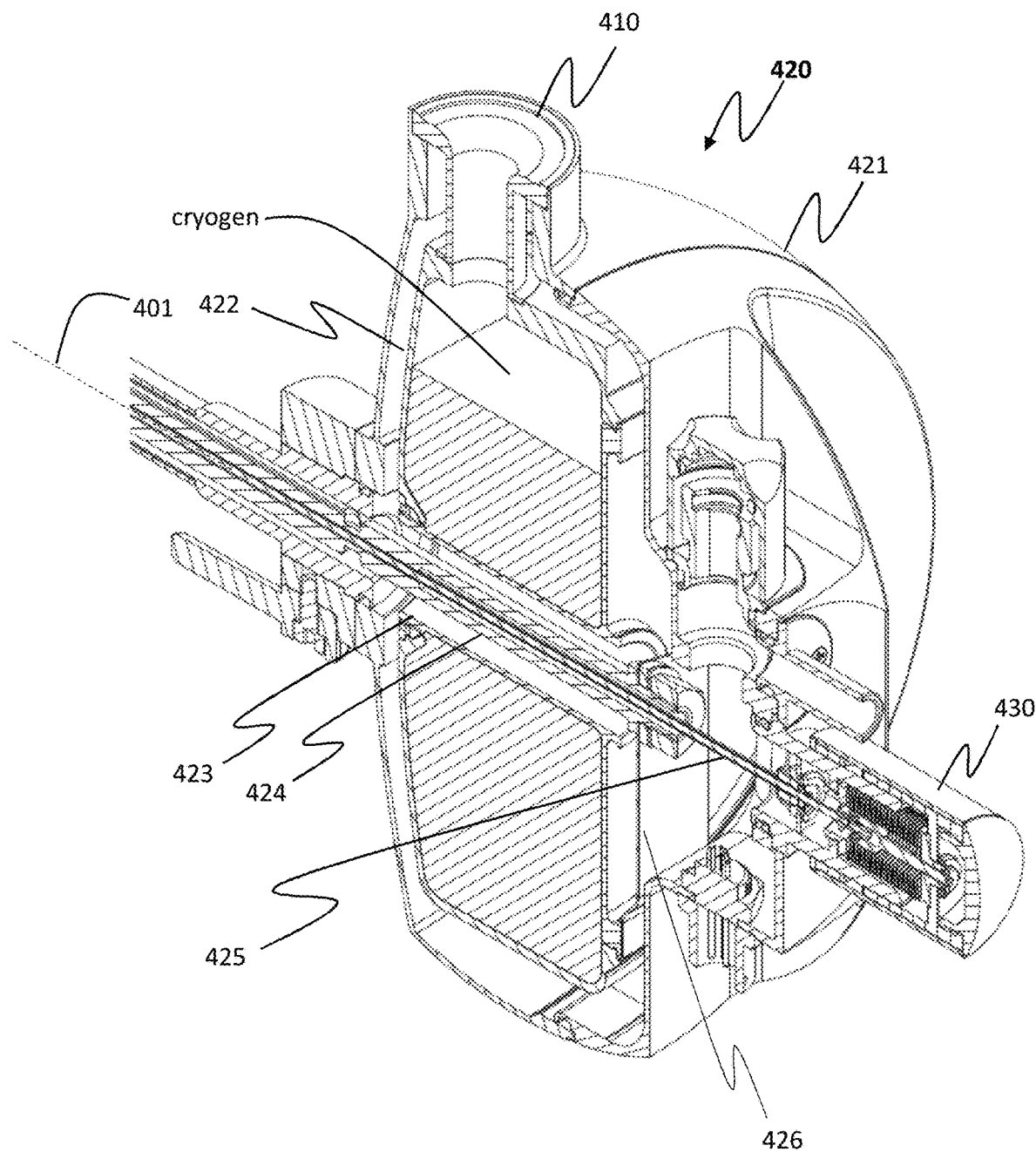
FIG. 5 is a cut away isometric view of the dewar of the cryotransfer holder of FIG. 4.

FIG. 4 shows one exemplary embodiment of a cryotransfer holder 400 according to one or more aspects described herein. As shown, cryotransfer holder 400 includes a sample holder tip 440 positioned at the end of a cylindrical cold conductor housing 450. The cold conductor housing places the tip 440 at the proper location inside the electron microscope when the holder is attached to the microscope goniometer. The thermal conductor housing 450 is attached to a dewar 420, which includes a dewar filling cap 410. Behind the dewar in this view is a manual sample shutter control knob 430. The coolant cools the dewar vessel, which is in thermal contact with a dewar thermal conductor 426, which is in further contact with a thermal conductor 424, as shown in FIG. 5. The cold conductor passes through the cold conductor housing 450 out to the region of the sample holder tip 440. The space between the cold conductor housing 450 and the thermal conductor 424 is a vacuum, thus insulating the thermal conductor 424 from ambient temperatures.

Figure 1:
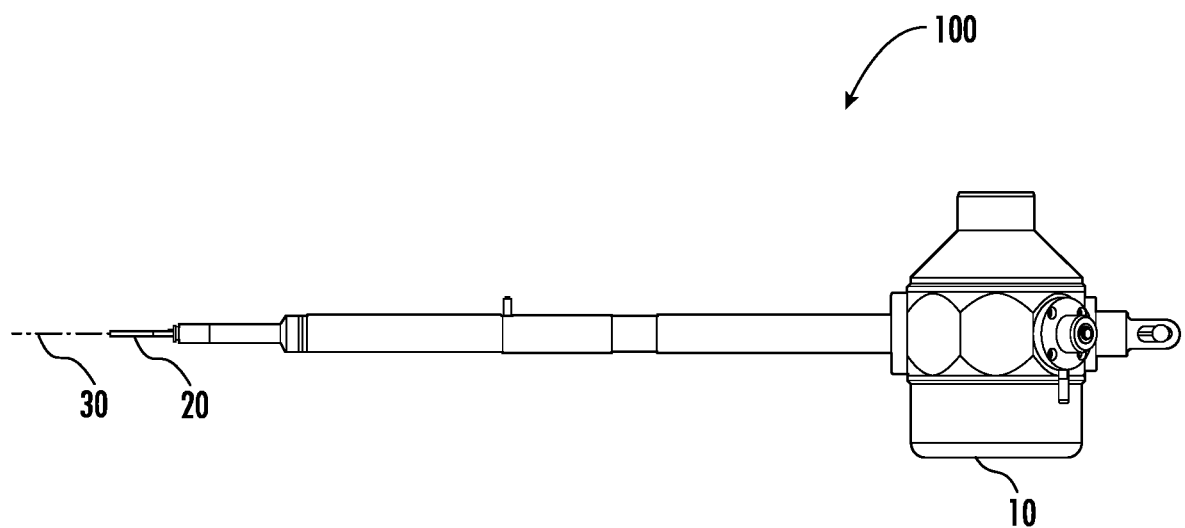
FIG. 1 is a side view of a prior art cryotransfer holder.
Figure 2:
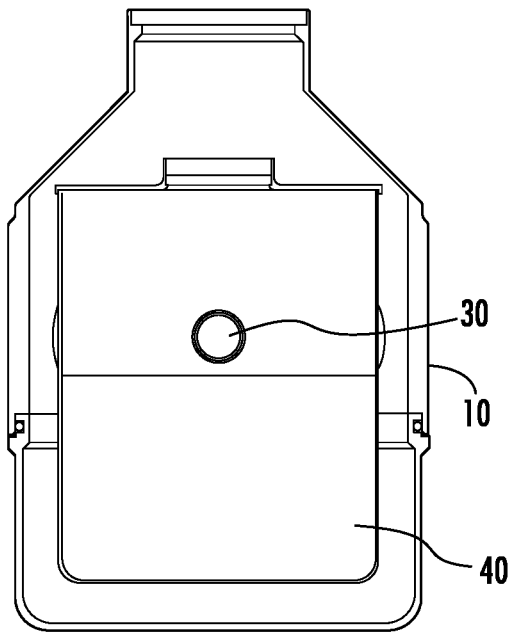
FIG. 2 is a cross section view of a prior art dewar of the cryotransfer holder of FIG. 1.
Figure 3:
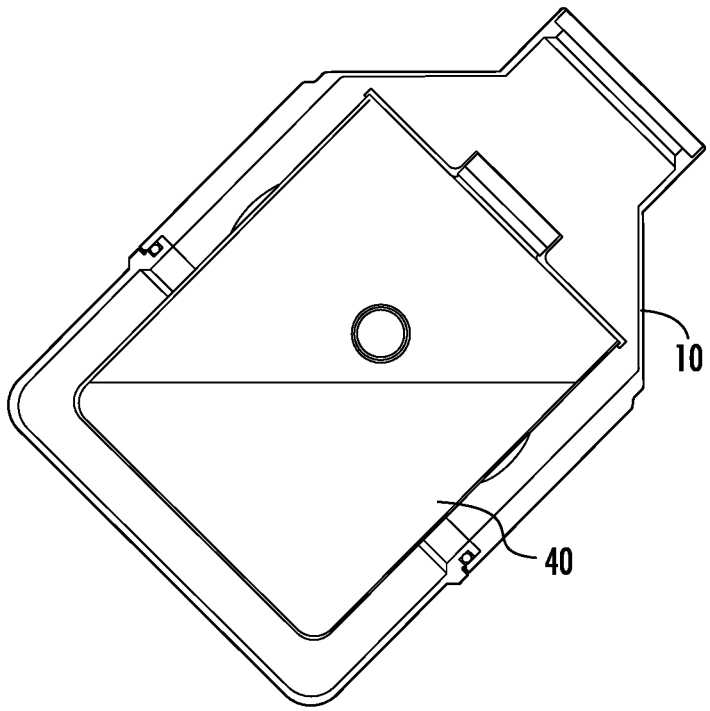
FIG. 3 is a cross section view of the prior art dewar of FIG. 2 shown rotated about the holder axis.
Figure 6:
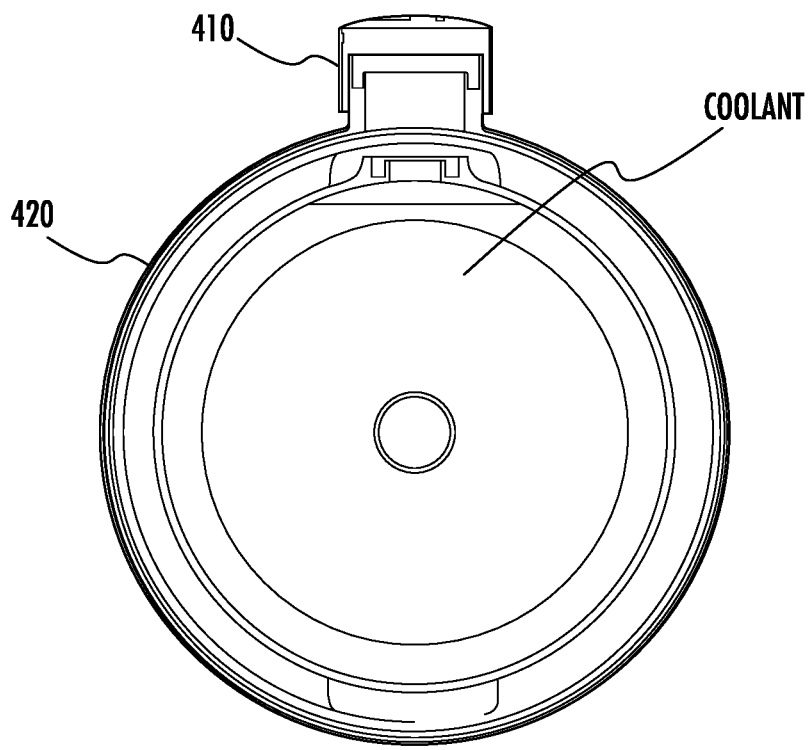
FIG. 6 is a cross section view of the dewar of the cryotransfer holder of FIG. 4.
Figure 7:
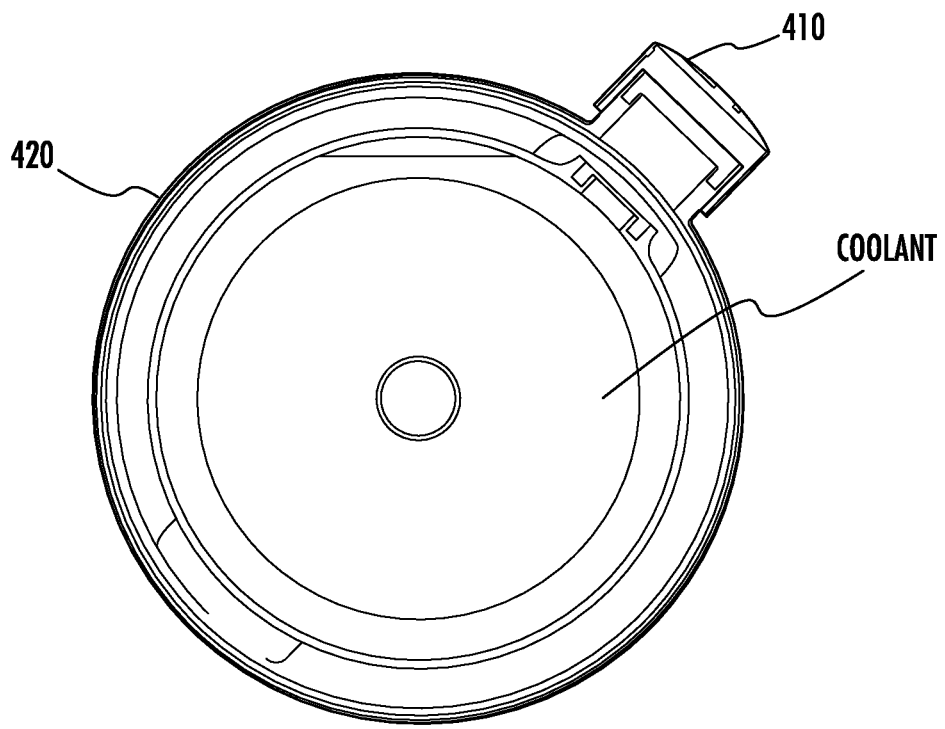
FIG. 7 is a cross section view of the dewar of the cryotransfer holder of FIG. 4 with the dewar shown rotated about the holder axis.

FIG. 5 is a detailed cross section of the dewar 420 and shutter control 430 portion of the cryo-transfer holder 400. The dewar 420, includes a dewar outer housing 421 and inner coolant vessel 422. The coolant vessel 422 has a sealed opening 423 in the center, through which passes a thermal conductor 424. Inside the cold conductor is a shutter control rod 425. FIGS. 6 and 7 show cross section views of the dewar 420, with the filling cap 410 vertical in FIG. 6 and with the dewar rotated and the fill cap 410 tilted in FIG. 7. These two figures show how the fluid is evenly distributed with respect to the center axis 401 of the cryotransfer holder 400, regardless of the angle of rotation about the axis. The horizontally-oriented cylindrical dewar maintains a center of mass for the holder about the holder's center axis regardless of the angle about the center axis at which the holder is rotated. This is in contrast to the prior art holder shown in FIGS. 2 and 3, wherein the vertically oriented dewar 10 causes an uneven distribution of fluid 40 with respect to center axis 30 when the dewar and the holder are rotated about the axis. There is more fluid to the left of the axis 30 in FIG. 3 than on the right of the axis. This uneven distribution, which constantly changes while the prior art holder and dewar are being rotated, places stress on the components supporting the dewar, which ultimately manifests as vibration or movement at the sample tip. The horizontally-oriented dewar cylinder of FIGS. 4-7, however, eliminates this force because the coolant fluid is always equally distributed on either side of the central axis 401 of the holder. Uneven weight distribution can occur from features on the dewar that depart from cylindrical symmetry about central axis 401. It is important to prevent or minimize these such features, and in cases were they are unavoidable then counterbalancing mass can be added to correct the uneven weight distribution.

Figure 8:
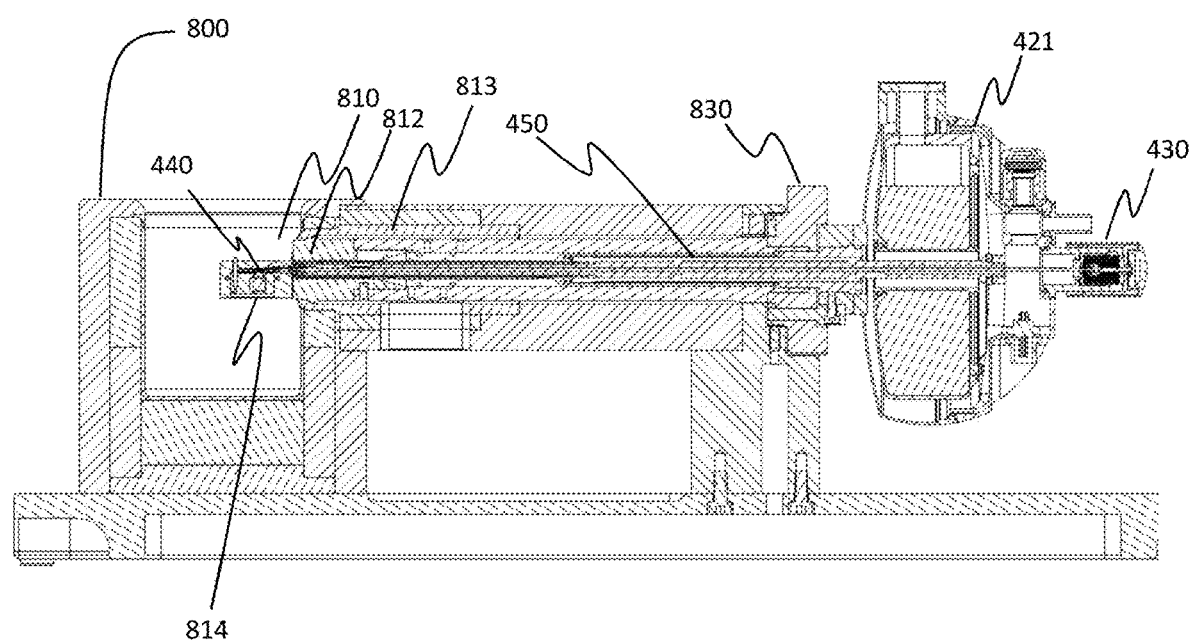
FIG. 8 is a sagittal cross section about the holder axis of the cryotransfer holder of FIG. 4 installed in a workstation according to a further embodiment described herein.

FIG. 8 shows an exemplary cryotransfer holder 400 installed in a workstation 800, configured for loading and unloading samples onto the holder at cryogenic temperatures. The workstation 800 includes a sample transfer space 810, which may be partially filled with a coolant, such as liquid nitrogen, to keep samples to be imaged at cryogenic temperatures when they are not installed in the transfer holder 400. More details about the workstation and its use with the transfer holder will be discussed below. Also shown in FIG. 8 are the transfer holder shutter control rod 425 extending through the thermal conductor 424. The manual control knob 430 for the shutter is shown at the right of the dewar housing 421.

Figure 9:
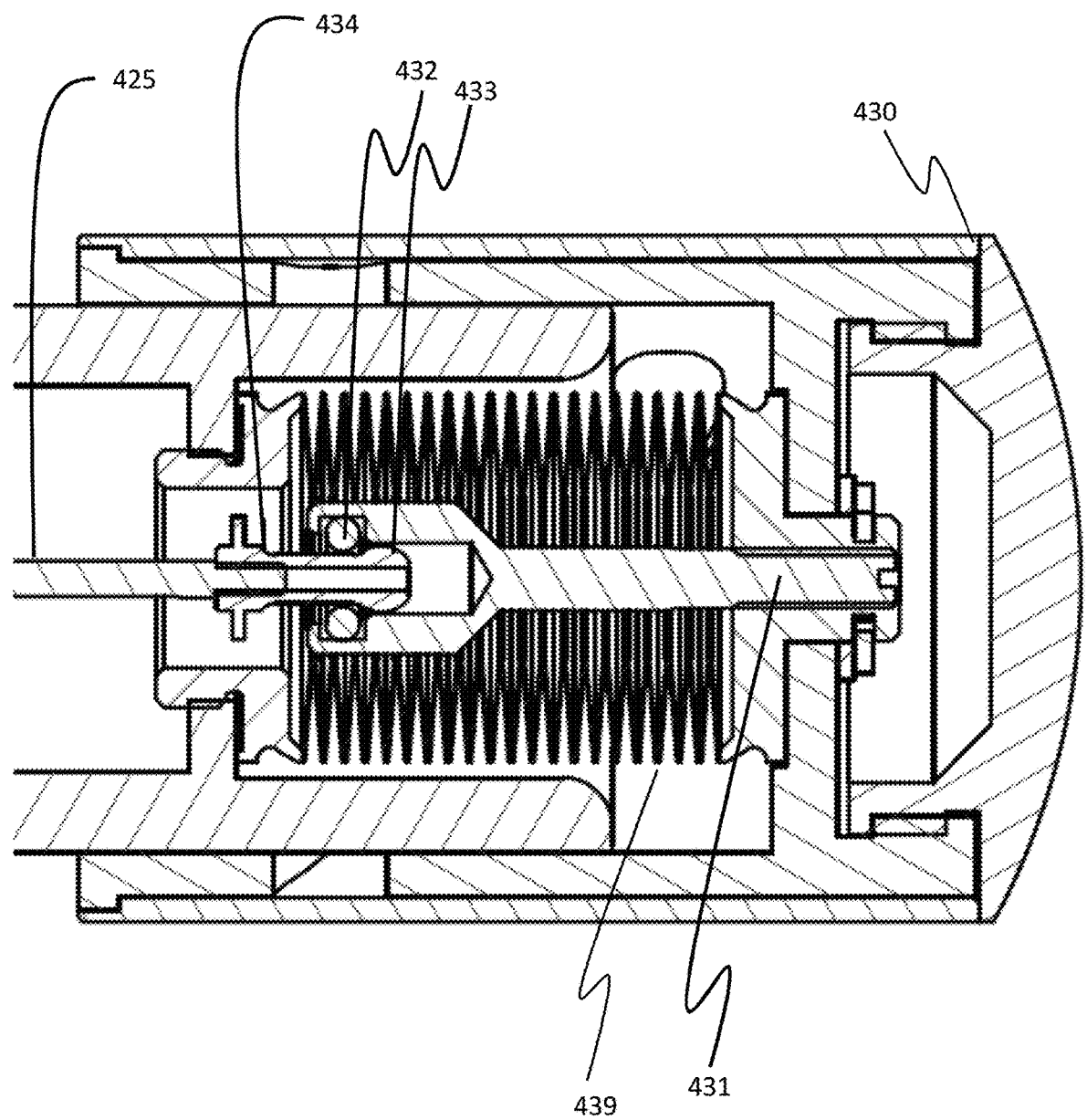
FIG. 9 is a detailed cross section view of a manual shutter control of the cryotransfer holder of FIG. 4 according to a further embodiment described herein.
Figure 10:
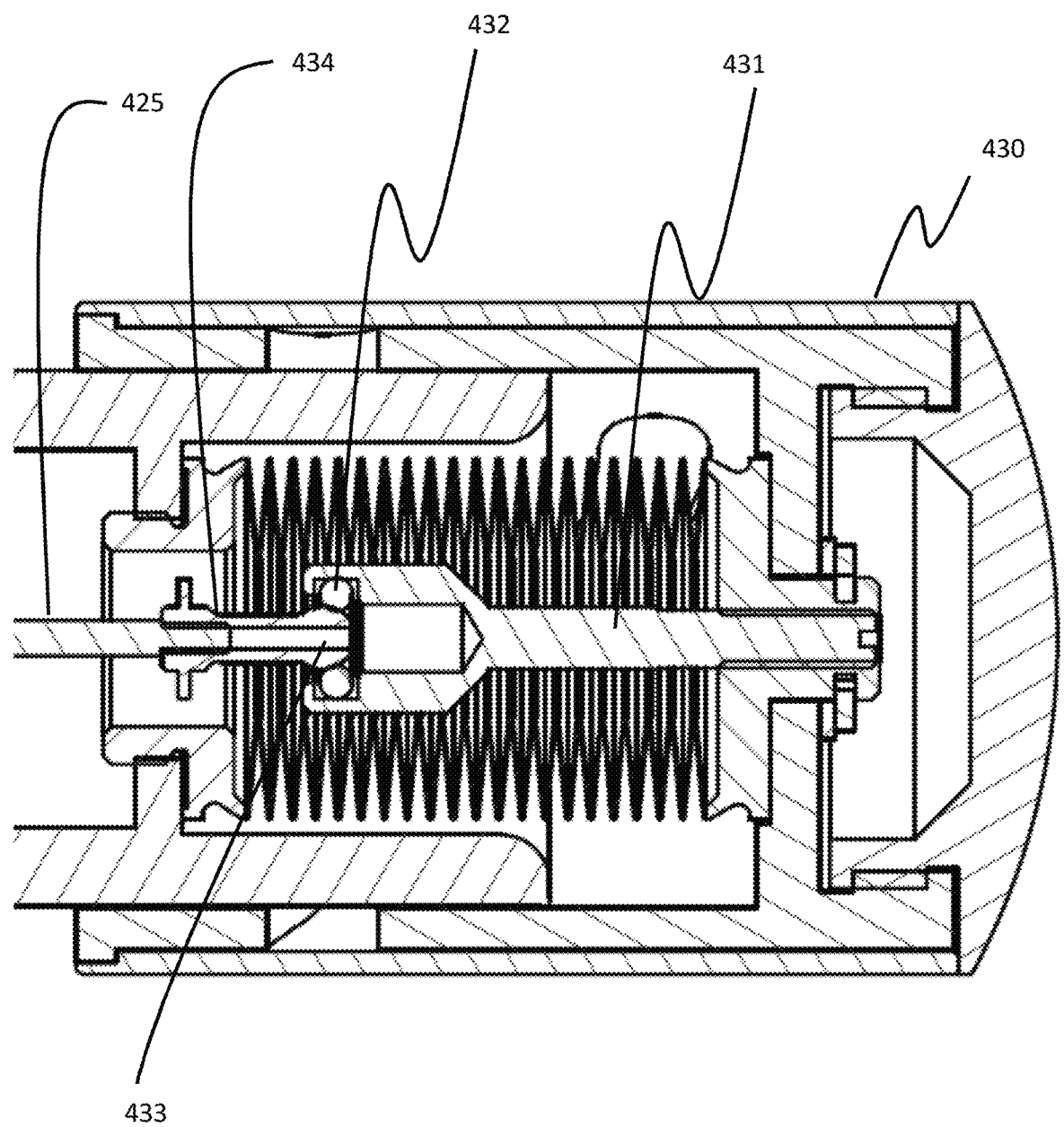
FIG. 10 is a further detailed cross section view of a manual shutter control of the cryotransfer holder of FIG. 4 according to a further embodiment described herein.
Figure 11:
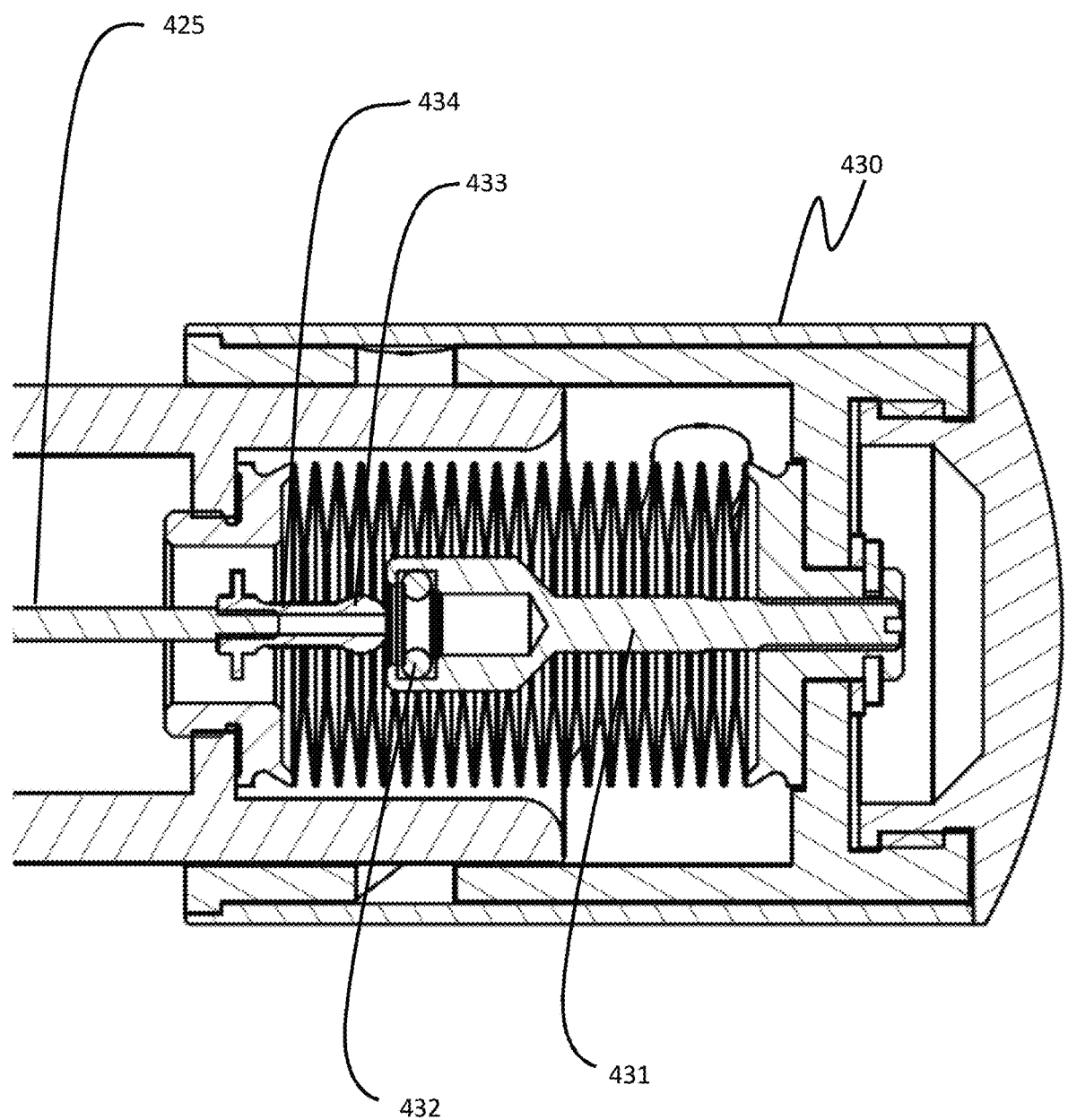
FIG. 11 is a further detailed cross section view of a manual shutter control of the cryotransfer holder of FIG. 4 according to a further embodiment described herein.

FIGS. 9, 10 and 11 are detailed views of the shutter control mechanism in three different states. The parts are the same in all three views. As shown, shutter control rod 425 is connected to a shutter control hitch 434 having a bulbous proximal end 433. The shutter control knob 430 is connected to an open-ended short rod 431. An O ring 432 fits in a groove at the distal end of the short rod 431. As shown in FIG. 9, the O ring 432 is over the shutter control hitch 434 such that the control knob 430 can move the control rod 425 by a sliding motion proximally and distally. The linkage of the control rod 425 to the shutter 442 will be described in detail below.

Figure 12:
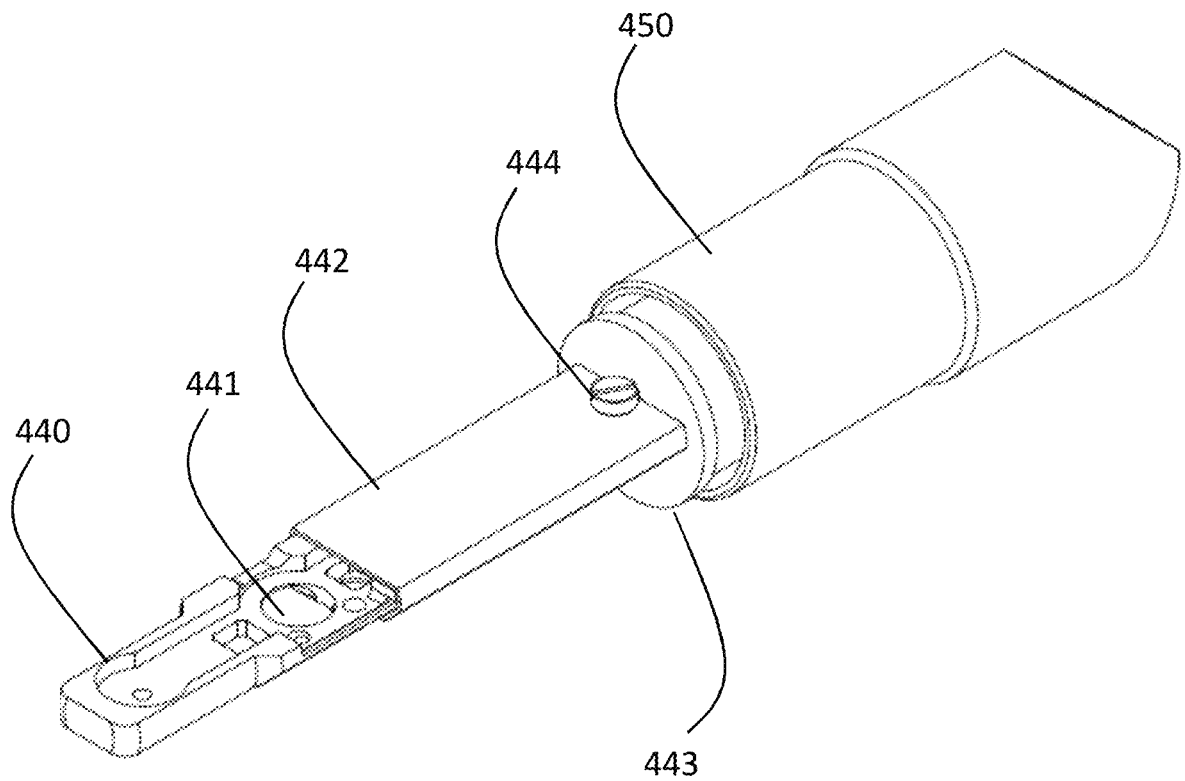
FIG. 12 is an isometric view detail of the sample holder according to a further embodiment described herein.
Figure 13:
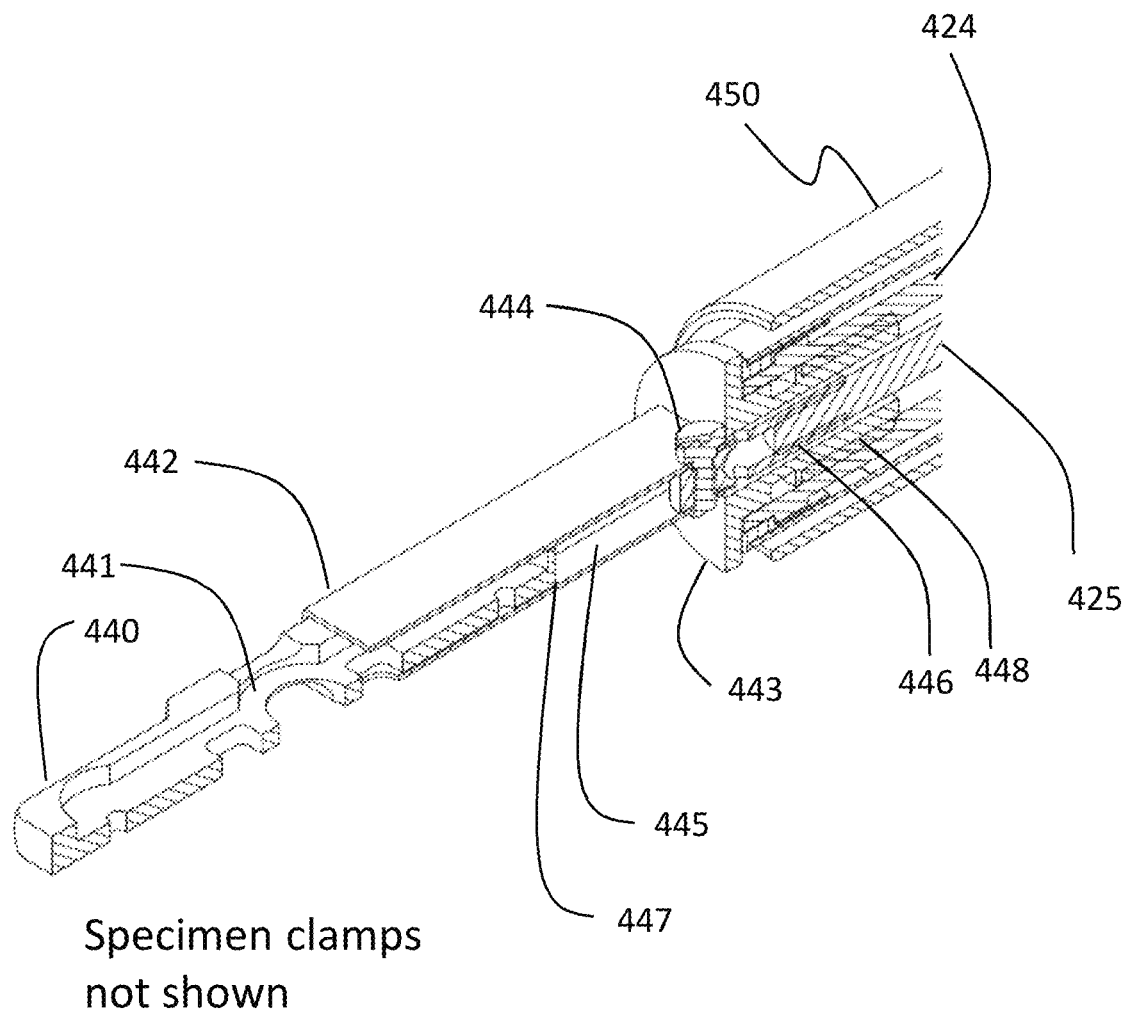
FIG. 13 is a cut away isometric view detail of the sample holder according to a further embodiment described herein.

In an embodiment described herein, the shutter control linkage just described can be decoupled from the control rod 425 and hitch 434 by pulling the control knob proximally such that the control rod 425 engages a stop at the distal end of the sample holder (shown in FIGS. 12 and 13 and described further below). FIG. 10 shows the O ring past the distal end of the control hitch 434 and FIG. 11 shows the O ring 432 and the short rod 431 fully disengaged from the control hitch 434. When in the disengaged state, as shown in FIG. 11, the control rod 425 is mechanically isolated from the control knob, which reduces vibration that would otherwise be transferred to the shutter and via the shutter to the sample holder 20. The vacuum bellows 439 allows distal control rod motion while maintaining vacuum integrity surrounding the control rod. The shutter mechanism will now be described, with reference to FIGS. 12 and 13.

FIG. 11 shows the mechanism in the shutter-closed position and the shutter control hitch bulbous end 433 engaged into O-ring 432. In this position the shutter cover 442 is protecting the TEM sample holder 441 shown in FIGS. 12 and 13 (Note, FIGS. 12 and 13 show the cover 442 in the open position). Rotating control knob 430 counter-clockwise causes the knob to move away from dewar housing 421 and pulls the control rod 425 outward which pulls the shutter cover 442 (See FIGS. 12, 13) into the shutter-open position and an end stop 444 (FIGS. 12, 13) prevents the control rod from further outward travel. In an embodiment, subsequent rotation of control knob 430 counter-clockwise causes control hitch bulbous end 433 and O-ring 432 to separate and disconnect as shown in FIG. 11. Rotating control knob 430 clockwise causes the knob to move toward dewar housing 421 and pushes O-ring 432 to contact the shutter control hitch bulbous end 433 as shown in FIG. 10. Further clockwise rotation of control knob 430 pushes control rod 425 and shutter cover 442 inward into the shutter-closed position. An end-stop 447 prevents the control rod from further inward travel, and the O ring 432 re-couples with the shutter control hitch bulbous end 433 as shown in FIG. 9.

The shutter mechanism will now be described, with reference to FIGS. 12 and 13. As shown, in one embodiment, shutter 442 is connected to the control rod 425 by a screw 444 that engages a control rod tip 446. The screw 425 travels proximally and distally in a slot 445 with the motion of the control rod 425 as actuated in the manner described above. As the screw 442 is moved by the control rod, the sample cover 442 is also advanced and withdrawn over the sample holding platform 441. The distal end 447 of the slot 445 acts as a travel stop for the control rod 425 and this limit to the distal motion of the control rod 425 allows the shutter control knob 430 to re-engage with the control rod 425 as described above. The end stop 443 stops the proximal motion of the control rod 425 and allows the user to disengage the control knob 430 from the control rod 425, as described above. End stop 443 is part of the sample tip 440. The proximal end 448 of the sample tip 440 fits into the distal end of the thermal conductor 424, thus establishing a direct thermal connection back to the dewar vessel 422.

The workstation 800 mechanism will now be described, with reference to FIGS. 8 and 16-21. The workstation 800 allows for loading or unloading a sample from the cryotransfer holder 400, while keeping the sample transfer space 810 surrounding the cryotransfer holder tip 440 and the sample well below −140 degrees Centigrade, and preferably below −170 degrees Centigrade. This is accomplished by keeping sample transfer space 810 substantially filled with a coolant (not shown), such as liquid nitrogen, and keeping the sample either submerged within the coolant or within a centimeter of the coolant surface or within the cooled cryotransfer holder at all times. The ability to rotate the sample holder 400 about the sample holder axis 401 while installed in the workstation 800 allows the user to load samples at whatever orientation is most ergonomic, as well as to remove samples from the holder by rotating to a position where gravity encourages the sample to fall out of the specimen holding platform 441. This functionality was not available in prior art cryo-holders and workstations.

With reference to FIG. 8, an exemplary workstation 800 comprises a sample transfer space 810, a sample holder receiving bushing 830. The receiving bushing is used to rotate the sample holder 400 while installed in the workstation 800. The workstation also includes a sample tip receiver 814, which is attached to an end piece 812. The end piece fits over the distal end of the sample holder thermal conductor outer housing 450. The end piece 812 fits into and makes an interference fit with gasket 813. The fit between the end piece 812 and the gasket 813 is sufficiently loose such that the end piece 812 can rotate in the gasket 813.

Figure 14:
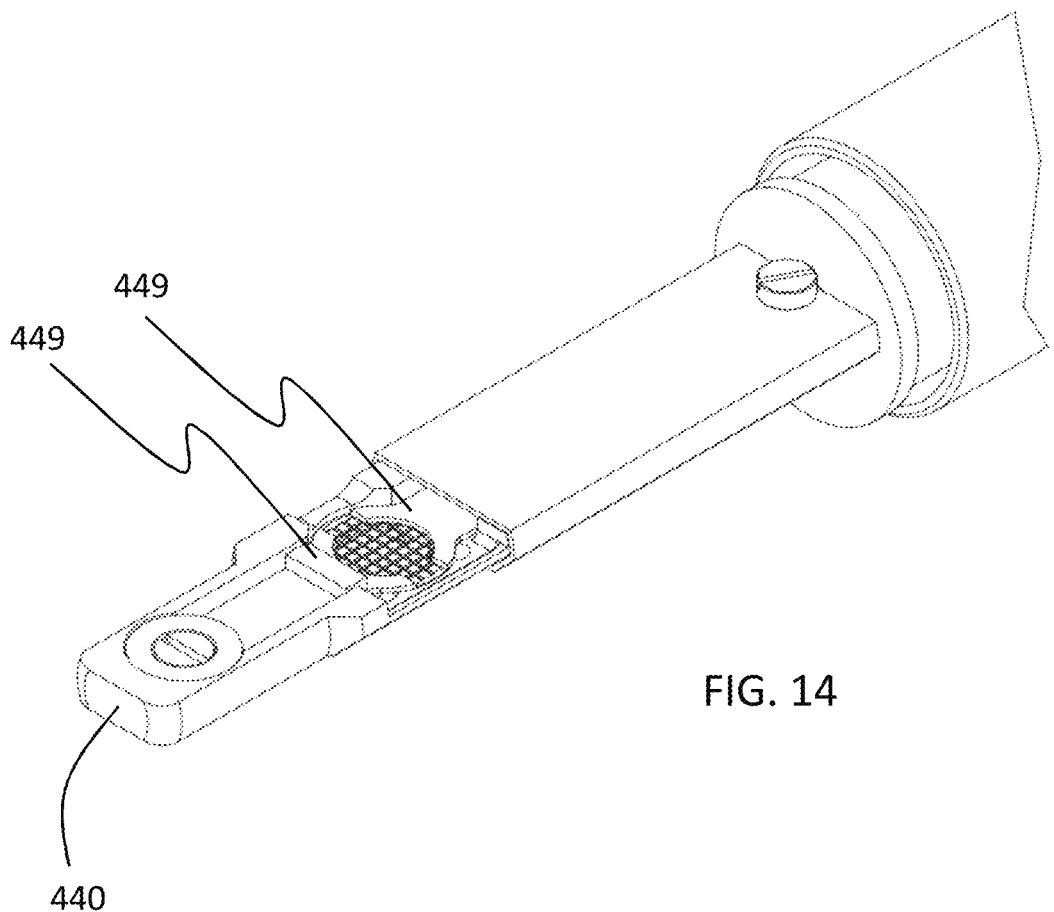
FIG. 14 is an isometric view detail of the sample holder according to a further embodiment described herein.
Figure 15:
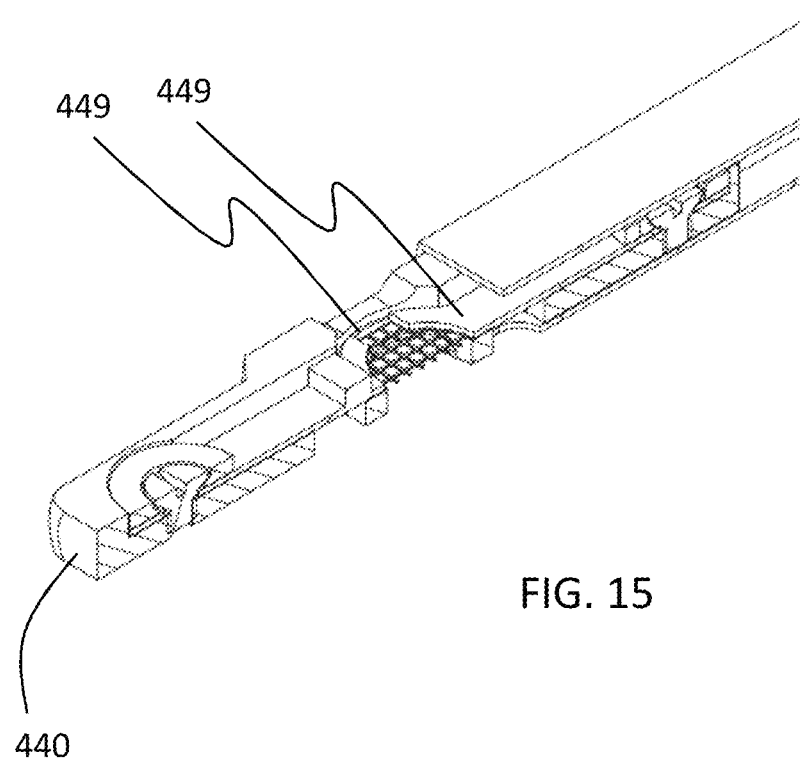
FIG. 15 is a cut away isometric view detail of the sample holder according to a further embodiment described herein.
Figure 16:
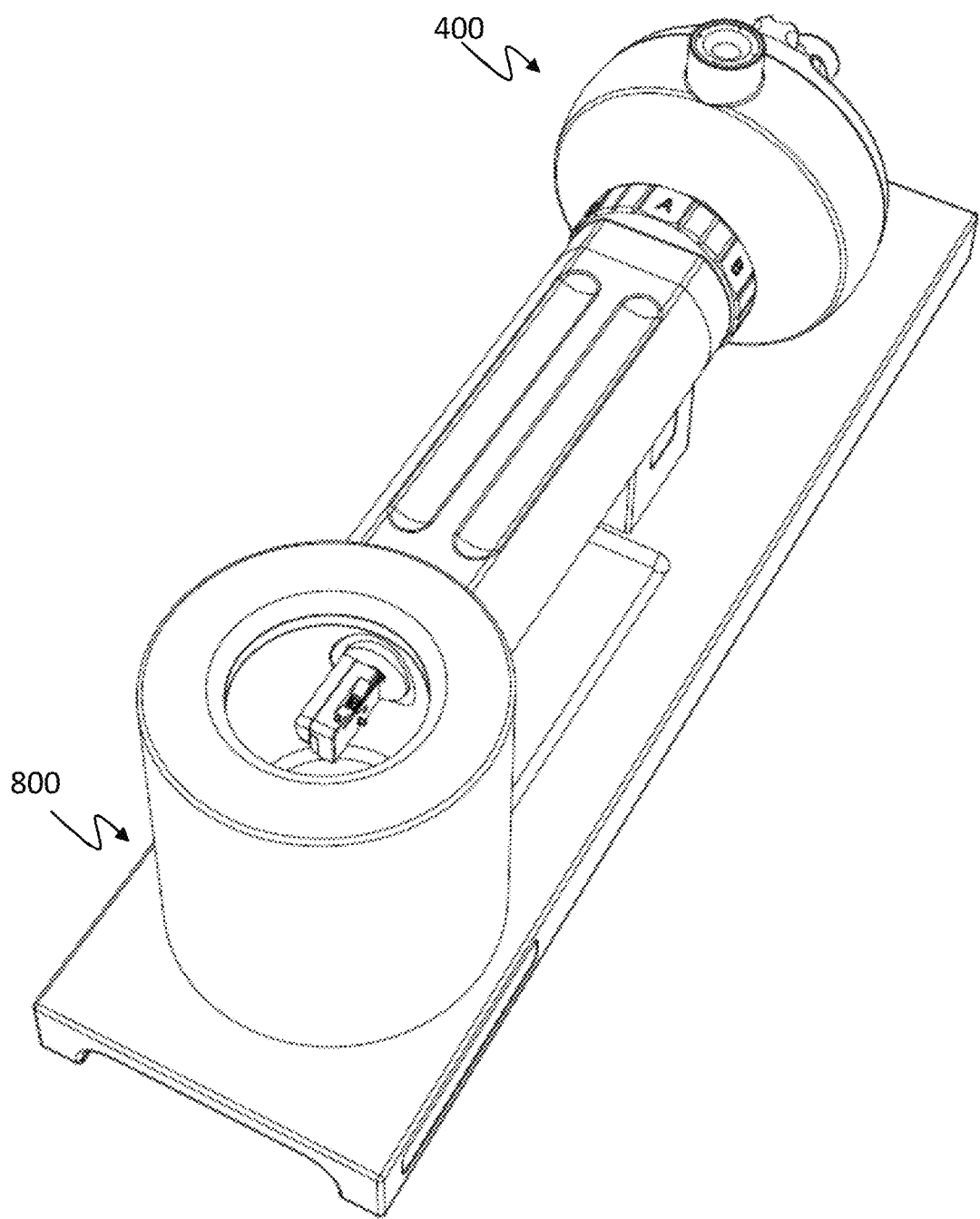
FIG. 16 is a view of the cryotransfer holder of FIG. 4 installed in a workstation and rotated to the workstation standard position, according to a further embodiment described herein.
Figure 17:
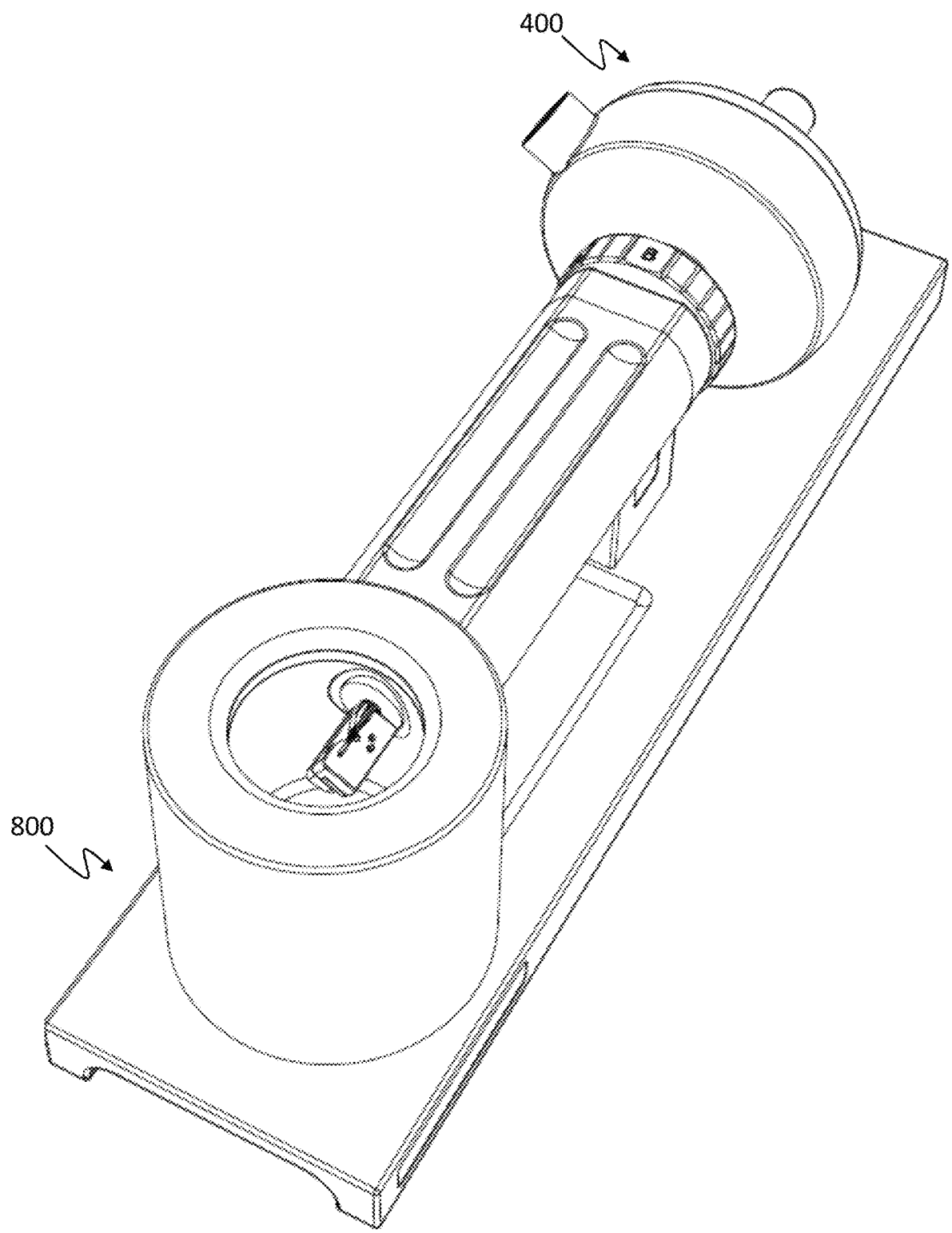
FIG. 17 is a view of the cryotransfer holder of FIG. 4 installed in a workstation and rotated to the workstation specimen loading position, according to a further embodiment described herein.
Figure 18:
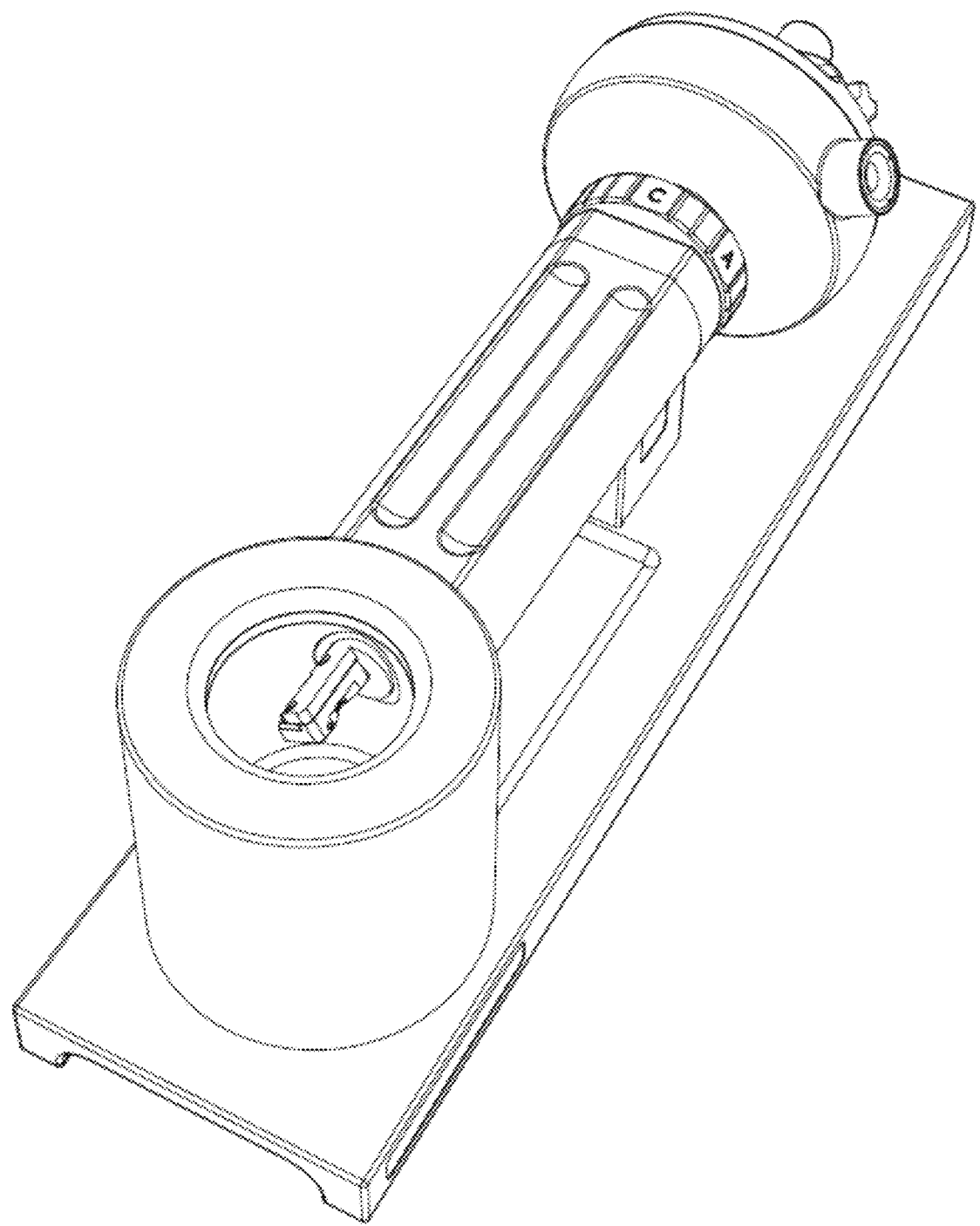
FIG. 18 is a view of the cryotransfer holder of FIG. 4 installed in a workstation and rotated to the workstation specimen removing position, according to a further embodiment described herein.
Figure 19:
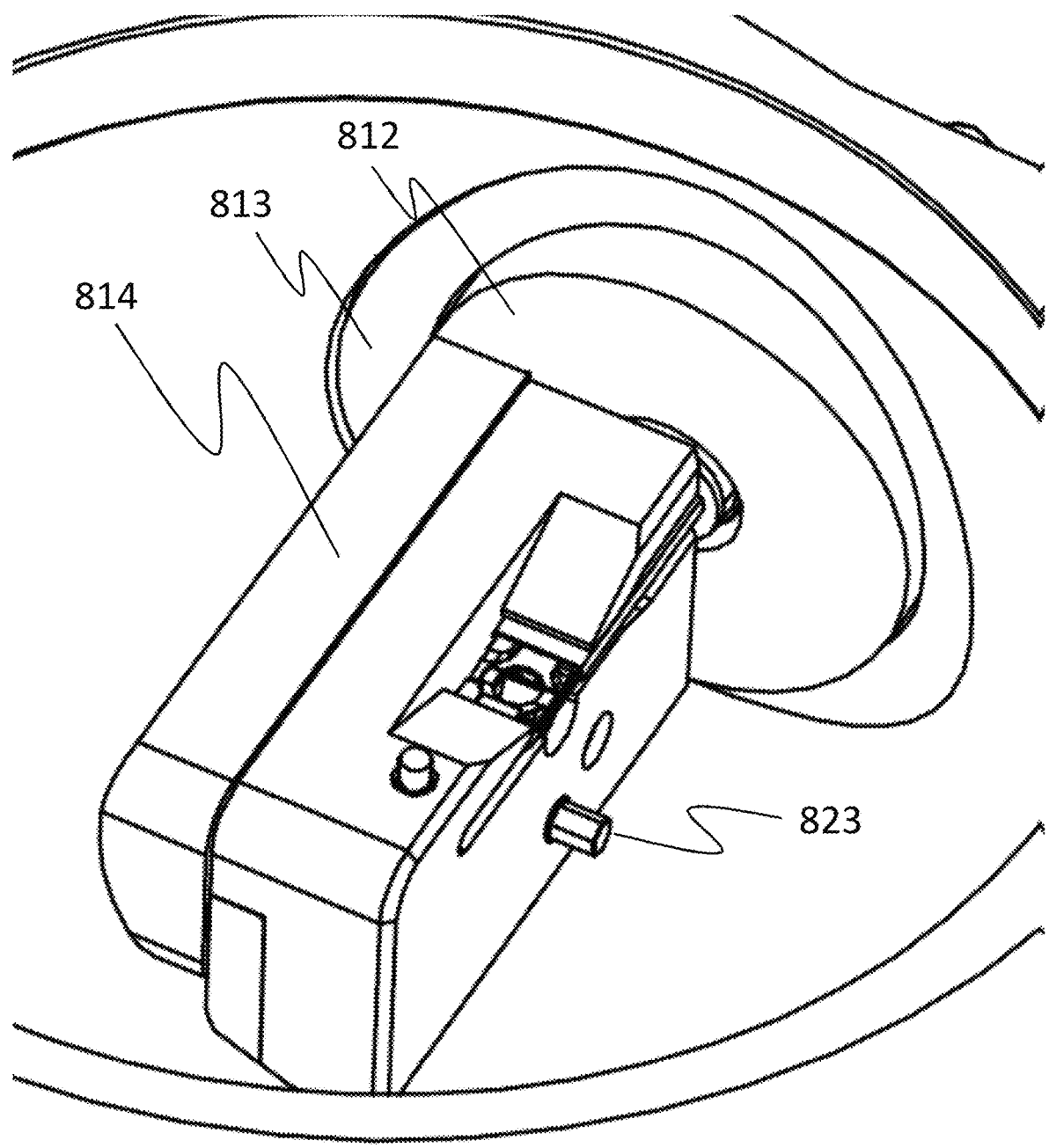
FIG. 19 is a magnified view of the cryotransfer holder tip and workstation of FIG. 14, according to a further embodiment described herein.
Figure 20:
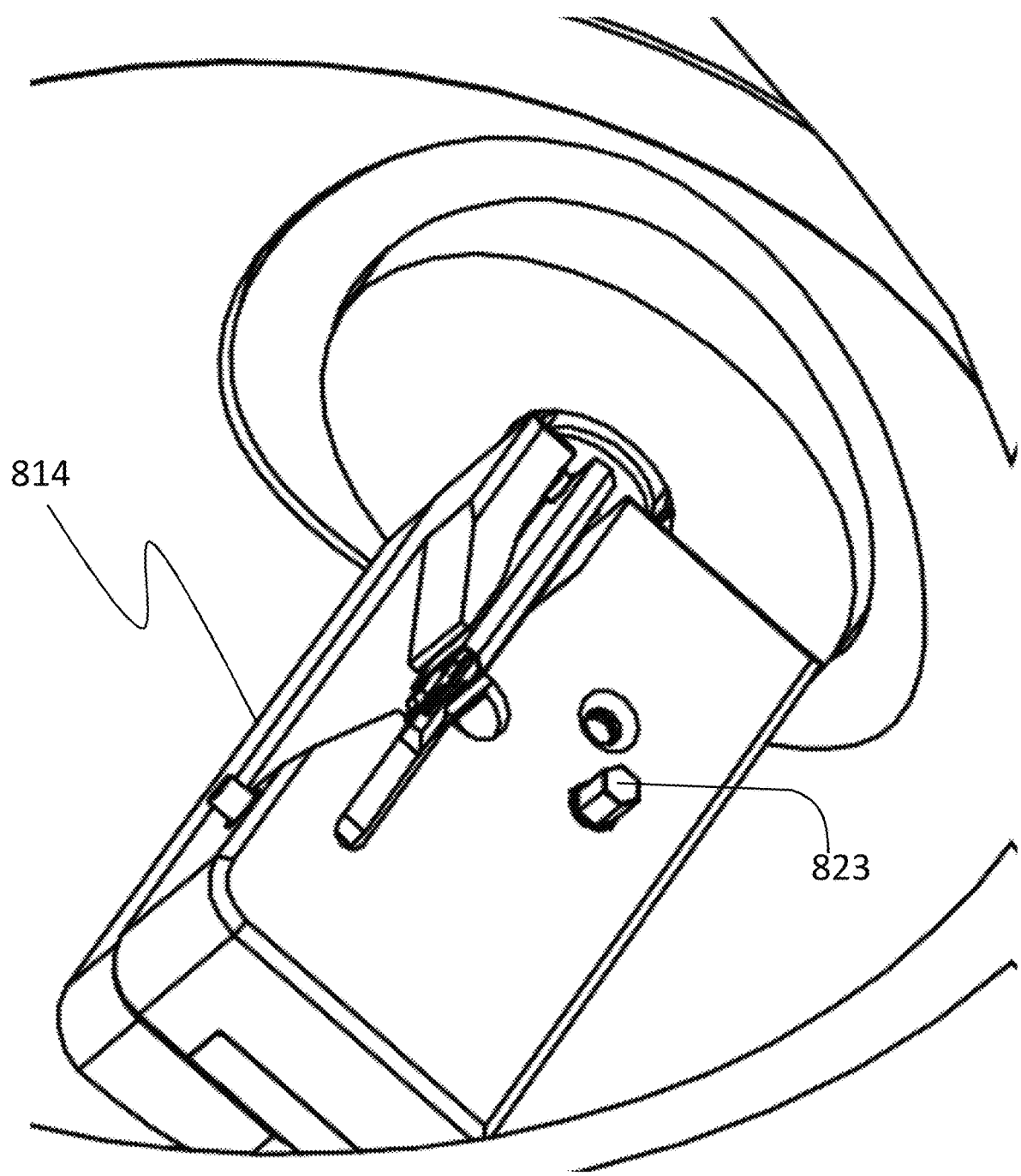
FIG. 20 is a magnified view of the cryotransfer holder tip and workstation of FIG. 15, according to a further embodiment described herein.
Figure 21:
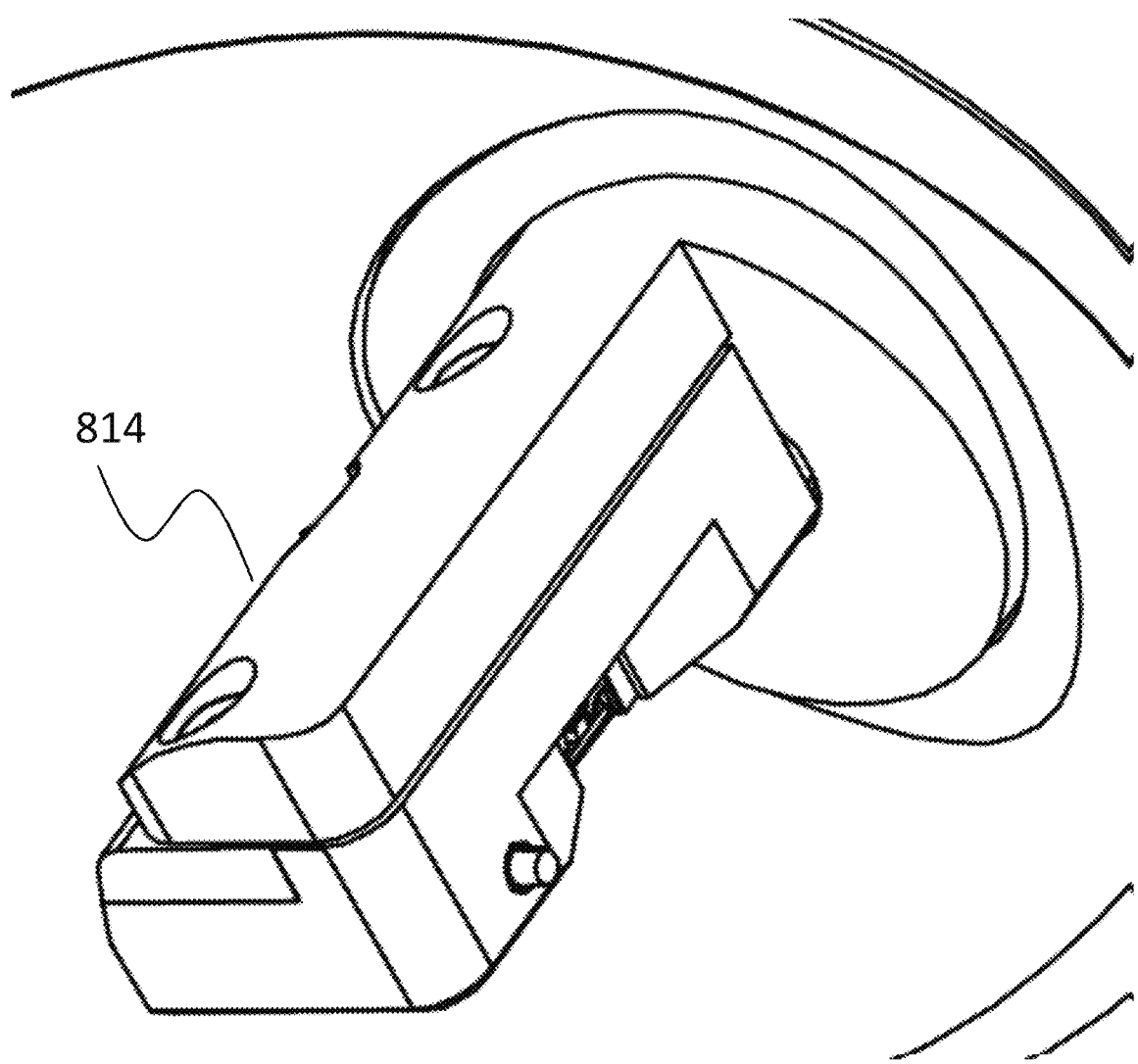
FIG. 21 is a magnified view of the cryotransfer holder tip and workstation of FIG. 16, according to a further embodiment described herein.

Loading a sample into the sample holder begins with inserting the holder into the workstation in the upright position, as shown in FIGS. 16 and 19. The shutter 442 is opened and the dewar 420 is filled with cryogen. The workstation sample transfer space 810 is filled with cryogen and a sample box containing the sample to be loaded into the cryotransfer holder is placed into the sample transfer space cryogen. The specimen clamps 449 shown in FIGS. 14, 15 are raised away from the specimen holding platform 441 by turning the clamp control screw 823 counter-clockwise. The sample holder is now rotated to the specimen loading workstation position shown in FIGS. 17 and 20. As shown in FIGS. 16-21, the specimen loading fixture 820 and the sample holder 400 rotate in unison and permit the sample to be loaded via tweezers in an ergonomically favorable vertical orientation between specimen clamps 449 and specimen holding platform 441. The specimen clamps 449 are lowered to clamp the specimen to the specimen holding platform 441 by turning the clamp control screw 823 clockwise. The shutter cover 442 is closed and the sample holder can safely be removed from the workstation.

Removing a sample from the sample holder begins with inserting the holder into the workstation in the upright position shown in FIGS. 16 and 19. The dewar 420 and the workstation sample transfer space 810 are filled with cryogen and a sample box for the sample to be removed from the cryotransfer holder is placed into the sample transfer space cryogen. The shutter cover 442 is opened. The specimen clamps 449 are raised away from the specimen holding platform 441 by turning the clamp control screw 823 counter-clockwise. The sample holder is now rotated to the specimen unloading workstation position shown in FIGS. 18 and 21. The specimen loading fixture 800 and the sample holder 400 rotate in unison and permit the sample to be unloaded as gravity encourages the sample to fall from the holder into the workstation sample transfer space cryogen. The sample is retrieved with tweezers and placed in the sample box.

Although the invention has been described in detail above, it is expressly understood that it will be apparent to persons skilled in the relevant art that the invention may be modified without departing from the spirit of the invention. Various changes of form, design, or arrangement may be made to the invention without departing from the spirit and scope of the invention. Therefore, the above-mentioned description is to be considered exemplary, rather than limiting, and the true scope of the invention is that defined in the following claims.

No element, act, or instruction used in the description of the present application should be construed as critical or essential to the invention unless explicitly described as such. Also, as used herein, the article "a" is intended to include one or more items. Further, the phrase "based on" is intended to mean "based, at least in part, on" unless explicitly stated otherwise.

The invention claimed is:

1. A workstation for mounting, at cryogenic temperature, a specimen into a cryotransfer holder having a sample holding platform and a center axis comprising,
   a receiving fixture configured to receive the cryotransfer holder,
   said receiving fixture comprising:
      a stationary sample transfer vessel; and
      an elongate chamber for receiving a portion of the cryotransfer holder,
      wherein said elongate chamber comprises bearing surfaces configured to allow rotation of the cryotransfer holder about its center axis when mounted in said receiving fixture
   wherein said receiving fixture comprises a sample tip receiver which is attached to an end piece of said elongate chamber, which end piece fits into a gasket, said gasket providing a seal between said stationary sample transfer vessel and said elongate chamber.

2. The workstation of claim 1, wherein said receiving fixture is configured to allow the sample holding platform to extend into said sample transfer vessel when the cryotransfer holder is mounted in said receiving fixture.

3. The workstation of claim 1, wherein said stationary sample transfer vessel is configured to contain a liquid cryogen.

4. The workstation of claim 1, comprising a cylindrical element having indicators for indicating a plurality of rotation positions of the cryotransfer holder.

5. The workstation of claim 1, wherein said end piece fits into said gasket sufficiently loosely such that said end piece can rotate in said gasket.

6. A system for mounting, at cryogenic temperature, a specimen into a cryotransfer holder comprising:
   a cryotransfer holder comprising:
      a sample holding platform and a center axis; and
   a workstation comprising:
      a receiving fixture configured to receive said cryotransfer holder,
   said receiving fixture comprising:
      a stationary sample transfer vessel, and
      an elongate chamber for receiving a portion of the cryotransfer holder,
      wherein said elongate chamber comprises bearing surfaces configured to allow rotation of said cryotransfer holder about its center axis when mounted in said receiving fixture, and
      wherein said receiving fixture comprises a sample tip receiver, which is attached to an end piece, which end piece fits into a gasket, said gasket providing a seal between said stationary sample transfer vessel and said elongate chamber.

7. The workstation of claim 6, wherein said receiving fixture is configured to allow the sample holding platform to extend into the sample transfer vessel when the cryotransfer holder is mounted in said receiving fixture.

8. The system of claim 6, wherein said stationary sample transfer vessel is configured to contain a liquid cryogen.

9. The system of claim 6, comprising a cylindrical element having indicators for indicating a plurality of rotation positions of the cryotransfer holder.

10. The system of claim 6, wherein said end piece fits into said gasket sufficiently loosely such that said end piece can rotate in said gasket.

11. The system of claim 6, wherein said cryotransfer holder further comprises a sample holder thermal conductor housing and wherein said end piece fits over the sample holder thermal conductor outer housing.

12. The system of claim 6, wherein said cryotransfer holder comprises a sample holder and wherein said workstation is configured to allow rotation of said cryotransfer holder about said central axis to a position such that a top side of said sample holder is at an angle of 90 degrees or less with respect to a level surface.

13. A method for mounting, at cryogenic temperature, a specimen into a cryotransfer holder comprising:
   placing a cryotransfer holder comprising a sample holding platform and a center axis into a workstation comprising a receiving fixture configured to receive said cryotransfer holder,
   wherein said receiving fixture comprises a stationary sample transfer vessel, and an elongate chamber for receiving a portion of the cryotransfer holder;
   extending the sample holding platform into the sample transfer vessel when the cryotransfer holder is mounted in said receiving fixture;
   mounting the specimen into the sample holding platform once the sample holding platform is inside the sample transfer vessel;
   rotating the cryotransfer holder about a center axis to remove the specimen.

14. The method of claim 13, further comprising cooling said sample transfer vessel with a liquid cryogen.

15. The method of claim 13, further comprising removing the specimen from the sample holding platform by rotating the cryotransfer holder about said center axis while said cryotransfer holder is in the workstation.

16. The method of claim 13, further comprising rotating the cryotransfer holder about said center axis to a position for actuating a specimen clamp.

\* \* \* \* \*